United States Patent
Aoki et al.

(10) Patent No.: US 11,183,834 B2
(45) Date of Patent: Nov. 23, 2021

(54) SEMICONDUCTOR MODULE AND POWER CONVERSION APPARATUS HAVING A DIODE BRIDGE CIRCUIT AND A PROTECTION CIRCUIT

(71) Applicant: Mitsubishi Electric Corporation, Tokyo (JP)

(72) Inventors: Nobuchika Aoki, Tokyo (JP); Rei Yoneyama, Tokyo (JP); Keisuke Eguchi, Tokyo (JP); Hiroki Hidaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/448,353

(22) Filed: Jun. 21, 2019

(65) Prior Publication Data

US 2020/0083700 A1     Mar. 12, 2020

(30) Foreign Application Priority Data

Sep. 6, 2018   (JP) .............................. JP2018-166532

(51) Int. Cl.
 *H02H 7/122*   (2006.01)
 *H02H 1/00*    (2006.01)
 (Continued)

(52) U.S. Cl.
 CPC .......... *H02H 7/122* (2013.01); *H02H 1/0007* (2013.01); *H02M 1/08* (2013.01);
 (Continued)

(58) Field of Classification Search
 CPC ...... H02H 7/122; H02H 7/127; H02H 7/1257; H02H 1/0007; H02H 9/025;
 (Continued)

(56) References Cited

U.S. PATENT DOCUMENTS 5,828,112 A * 10/1998 Yamaguchi ......... H01L 27/0635
  257/378
6,194,856 B1 * 2/2001 Kobayashi ............ H02M 7/003
  318/432
(Continued)

FOREIGN PATENT DOCUMENTS

CN   103701086 A  *  4/2014
CN   105140889 A  *  12/2015
(Continued)

OTHER PUBLICATIONS

Datasheet, "Silicon Coarbide Schottky Rectifier Bridge", IXYS, 2008 (Year: 2008).*

(Continued)

*Primary Examiner* — Kyle J Moody
*Assistant Examiner* — Jye-June Lee
(74) *Attorney, Agent, or Firm* — Studebaker & Brackett PC

(57) ABSTRACT

A semiconductor module includes a diode bridge circuit, a sensor configured to measure a current value of the diode bridge circuit, a current limiting circuit having an IGBT connected to the diode bridge circuit, and a protection circuit configured to switch ON and OFF the IGBT in accordance with the current value of the diode bridge circuit measured by the sensor.

9 Claims, 17 Drawing Sheets

(51) Int. Cl.
*H02M 5/458* (2006.01)
*H02M 1/08* (2006.01)
*H01L 25/18* (2006.01)
*H01L 25/065* (2006.01)
*H02M 1/00* (2006.01)

(52) U.S. Cl.
CPC ....... *H02M 5/4585* (2013.01); *H01L 25/0655* (2013.01); *H01L 25/18* (2013.01); *H02M 1/0009* (2021.05)

(58) Field of Classification Search
CPC ........ H02M 5/4585; H02M 2001/0009; H01L 25/0655; H01L 25/18
See application file for complete search history.

(56) References Cited

U.S. PATENT DOCUMENTS

| | | | | |
|---|---|---|---|---|
| 2013/0033794 | A1* | 2/2013 | Baek | H02H 7/18 361/93.9 |
| 2013/0257301 | A1* | 10/2013 | Tran | H01J 37/248 315/200 R |
| 2013/0336028 | A1* | 12/2013 | Kawamura | H02M 1/4233 363/53 |

FOREIGN PATENT DOCUMENTS

| | | | |
|---|---|---|---|
| JP | H10-239360 | A | 9/1998 |
| JP | 2000-270468 | A | 9/2000 |
| JP | 2007-159344 | A | 6/2007 |
| JP | 2008-042124 | A | 2/2008 |
| JP | 2008-072848 | A | 3/2008 |
| JP | 2010-172183 | A | 8/2010 |
| JP | 2012-070531 | A | 4/2012 |
| JP | 2014-045551 | A | 3/2014 |
| JP | 2015-012706 | A | 1/2015 |
| KR | 20170021407 | A * | 2/2017 |
| TW | 201517471 | A * | 5/2015 ............. H02M 1/34 |

OTHER PUBLICATIONS

X. Huang, D. Chang and T. Q. Zheng, "Research on control characteristics of PWM rectifier with RC-IGBT," 2017 12th IEEE Conference on Industrial Electronics and Applications (ICIEA), Siem Reap, 2017, pp. 1570-1575. (Year: 2017).*

An Office Action; "Notice of Reasons for Refusal", mailed by the Japanese Patent Office dated Jul. 13, 2021, which corresponds to Japanese Patent Application No. 2018-166532 and is related to U.S. Appl. No. 16/448,353; with English language translation.

* cited by examiner

-- Prior Art --

-- Prior Art --

SEMICONDUCTOR MODULE AND POWER CONVERSION APPARATUS HAVING A DIODE BRIDGE CIRCUIT AND A PROTECTION CIRCUIT

BACKGROUND OF THE INVENTION

Field of the Invention

The present invention relates to a semiconductor module configured to sense and limit an overcurrent of a diode bridge circuit.

Description of the Background Art

As one of power modules, there is a converter module equipped with a diode bridge circuit to convert an alternating current to a direct current. As one of the converter modules, there is an IPM (Intelligent Power Module) for a converter equipped with a protection function circuit. In the IPM for converter, an IGBT (Insulated Gate Bipolar Transistor), which is an active element connected in anti-parallel to a diode is equipped with a current sensor or a temperature sensor. In the converter module, it is mainly the diode of the diode bridge circuit that generates heat by the current flowing therein. However, since an element equipped with the current sensor and capable of protective shutdown is the IGBT, there is a problem that the protective shutdown is delayed at the time of an energization abnormality, and the module breaks down.

Conventionally, in the converter module, a thyristor and a resistor are connected in parallel between the diode bridge circuit and an inverter circuit. When the power supply is activated, the thyristor is off, and a current flows to a resistor side, which prevents an inrush current. When the thyristor is turned on after a charging time of an electrolytic capacitor has elapsed, a current flows to a thyristor side to suppress generation loss of the circuit.

However, since the thyristor cannot be turned off once it is turned on, there is a problem that the diode bridge circuit or a customer system breaks down when an energization abnormality such as an overcurrent occurs during the activation of the power supply.

Japanese Patent Application Laid-Open No. 2000-270468 discloses a power supply control apparatus that senses a current flowing through an AC-DC converter by a current detection circuit and prevents an inrush current after turning on the power supply. In the power supply control apparatus of Japanese Patent Application Laid-Open No. 2000-270468, when the current detection circuit detects a current value equal to or larger than a certain value, a switch control circuit operates a switch circuit to short-circuit both ends of a resistor, thereby preventing the inrush current. However, the power supply control apparatus of Japanese Patent Application Laid-Open No. 2000-270468 has a problem that it does not have a function of turning off an AC switch when an energization abnormality such as an overcurrent occurs during power supply activation, and cannot control a current flowing through the AC-DC converter, so that the AC-DC converter breaks down.

SUMMARY

It is an object of the present invention to provide a semiconductor module which can be protected when an energization abnormality such as an overcurrent occurs during activation.

A semiconductor module of the present invention includes a diode bridge circuit, a sensor, a current limiting circuit, and a protection circuit. The sensor measures a current value of the diode bridge circuit. The current limiting circuit has a first switching element connected to the diode bridge circuit. The protection circuit switches ON and OFF the first switching element in accordance with the current value of the diode bridge circuit measured by the sensor.

In the semiconductor module of the present invention, since the current limiting circuit has the first switching element, it is possible to suppress not only an inrush current at the time of power supply activation start but also a subsequent overcurrent.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Underlying Art

Figure 1:
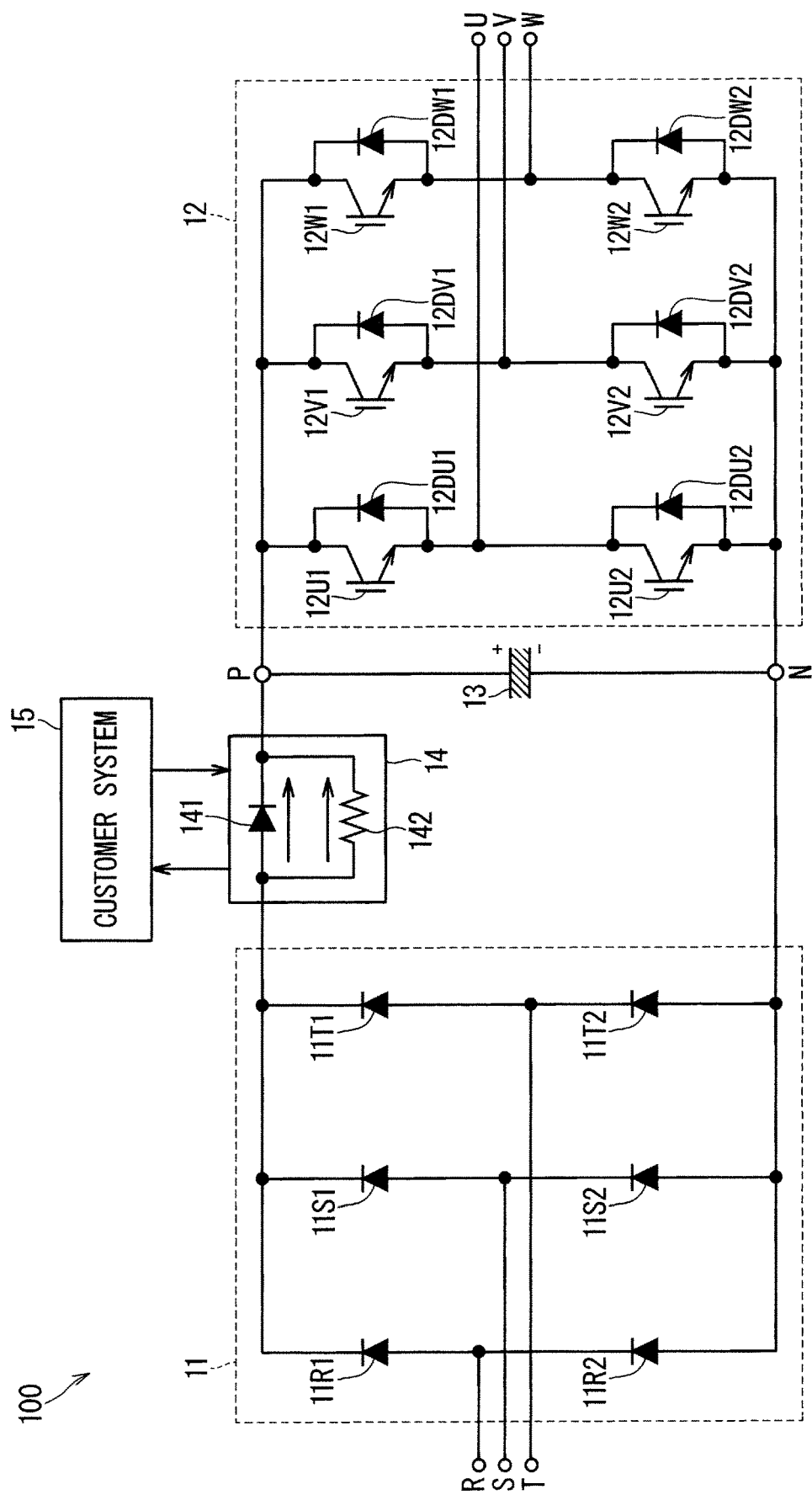
FIG. 1 is a circuit diagram of a semiconductor module of the underlying art.

FIG. 1 is a circuit diagram of a semiconductor module 100 of the underlying art. A semiconductor module 100 is an inverter module including a diode bridge circuit 11, an inverter circuit 12, an electrolytic capacitor 13, and a current limiting circuit 14.

The diode bridge circuit 11 includes a diode 11R1 of an R phase upper arm, a diode 11R2 of an R phase lower arm, a diode 11S1 of an S phase upper arm, 11S2 of an S phase lower arm, a diode 11T1 of a T phase upper arm, and a diode 11T2 of a T phase lower arm. Cathodes of the diodes 11R1, 11S1, 11T1 are connected to a P terminal of the electrolytic capacitor 13 via the current limiting circuit 14, and anodes of the diodes 11R2, 11S2, 11T2 are connected to an N terminal of the electrolytic capacitor 13.

The inverter circuit 12 includes an IGBT 12U1 of a U phase upper arm, an IGBT 12U2 of a U phase lower arm, an IGBT 12V1 of a V phase upper arm, an IGBT 12V2 of a V phase lower arm, an IGBT 12W1 of a W phase upper arm, and an IGBT 12W2 of a W phase lower arm. Moreover, diodes 12DU1, 12DU2, 12DV1, 12DV2, 12DW1, 12DW2 are connected in anti-parallel to the IGBTs 12U1, 12U2, 12 V1, 12V2, 12W1, 12W2, respectively. Collectors of the IGBTs 12U1, 12V1, 12W1 are connected to the P terminal of the electrolytic capacitor 13, and emitters of the IGBTs 12U2, 12V2, 12W2 are connected to the N terminal of the electrolytic capacitor 13.

The current limiting circuit 14 is connected between the diode bridge circuit 11 and the inverter circuit 12. One end of the current limiting circuit 14 is connected to the cathodes of the diodes 11R1, 11S1, 11T1, and another end is connected to the P terminal of the electrolytic capacitor 13. The current limiting circuit 14 has a configuration in which a thyristor 141 and a current limiting resistor 142 are connected in parallel.

Figure 2:
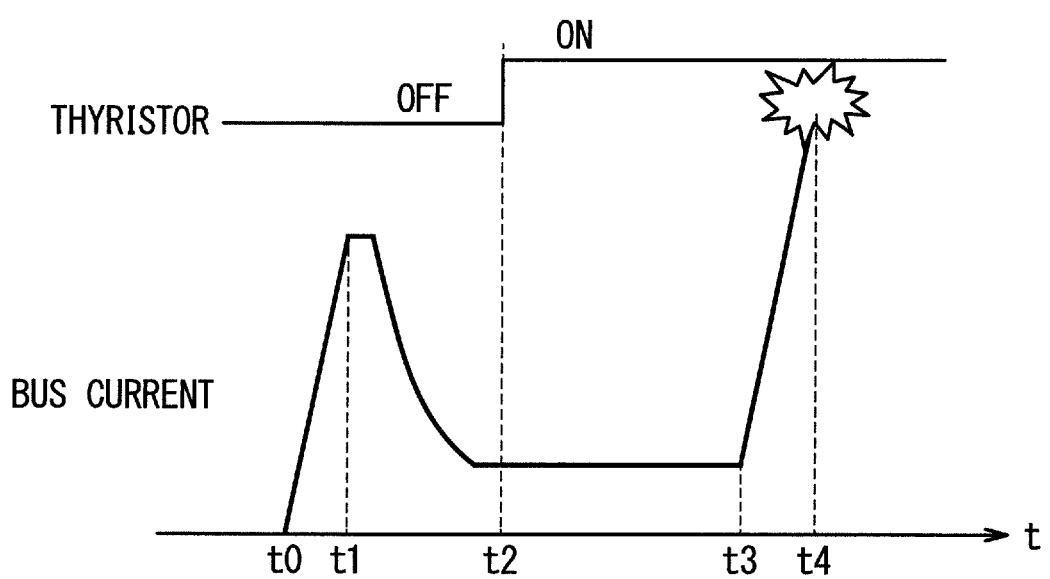
FIG. 2 is a diagram showing transition of a bus current after power supply activation in the semiconductor module.

FIG. 2 shows transition of a bus current after power supply activation in the semiconductor module 100. When a power supply (not shown) connected to R, S, T phase terminals of the diode bridge circuit 11 is activated at a time t0, the bus current increases. At this time, since the thyristor 141 is off, the bus current flows through the current limiting resistor 142. Accordingly, the increase of the bus current peaks at a certain value at a time t1, and an overcurrent is prevented. When charging of the electrolytic capacitor 13 is completed, the thyristor 141 is turned on at a time t2. When the thyristor 141 is turned on, the bus current flows through the thyristor 141, which suppresses a loss in the current limiting circuit 14. However, once the thyristor 141 is turned on, it cannot be turned off. Therefore, even if an energization abnormality such as an overcurrent occurs at a time t3 thereafter, the thyristor 141 cannot be turned off to limit the current, so that the diode bridge circuit 11 or the customer system 15 breaks down at a time t4.

In contrast, in a converter module of each preferred embodiment described below, a diode bridge circuit 11 or a customer system 15 is protected when an energization abnormality such as an overcurrent occurs during power supply activation.

B. First Preferred Embodiment

<B-1. Configuration>

Figure 3:
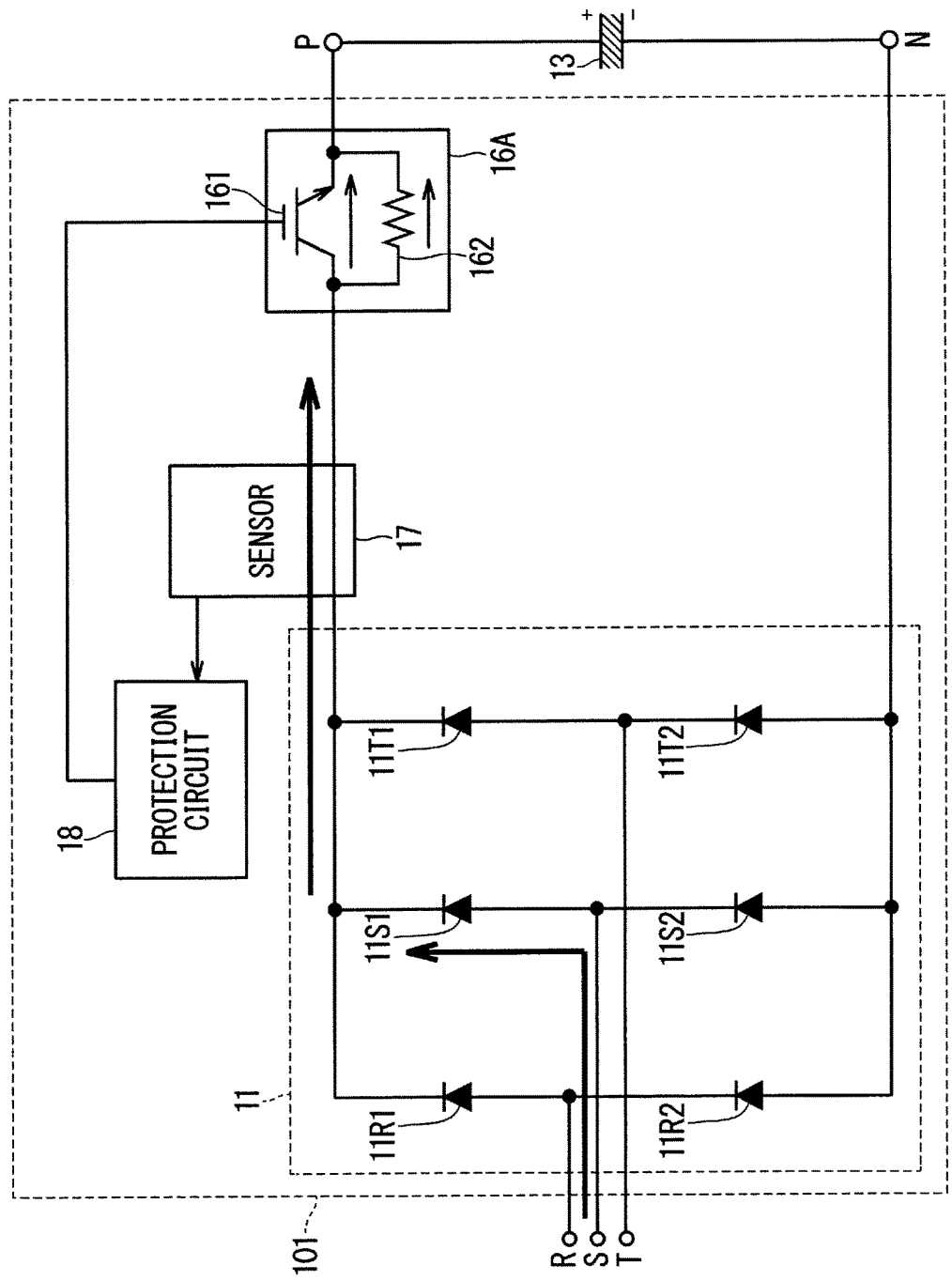
FIG. 3 is a circuit diagram of a semiconductor module according to a first preferred embodiment.

FIG. 3 is a circuit diagram of a semiconductor module 101 according to a first preferred embodiment. The semiconductor module 101 is a converter module including a diode bridge circuit 11, a current limiting circuit 16A, a sensor 17, and a protection circuit 18. An electrolytic capacitor 13 is connected between output terminals P and N of the semiconductor module 101. A configuration of the diode bridge circuit 11 is similar to that in the underlying art.

The sensor 17 is connected to cathodes of diodes 11R1, 11S1, 11T1 of the diode bridge circuit 11, and measures a current value of the diode bridge circuit 11. That is, the sensor 17 measures a total value of currents flowing through the diodes 11R1, 11S1, 11T1.

The current limiting circuit 16A has one end connected to the sensor 17, and another end connected to the P terminal of the electrolytic capacitor 13. The current limiting circuit 16A has a configuration in which an IGBT 161 as a first switching element, and a current limiting resistor 162 are connected in parallel. Here, the IGBT 161 is used as the first switching element, but another transistor such as a MOSFET (Metal-Oxide-Semiconductor Field-Effect Transistor) may be used.

The protection circuit 18 is electrically connected to the sensor 17 and controls ON and OFF of the IGBT 161 of the current limiting circuit 16A in accordance with a value of an output current of the diode bridge circuit 11 measured by the sensor 17.

<B-2. Operation>

Figure 4:
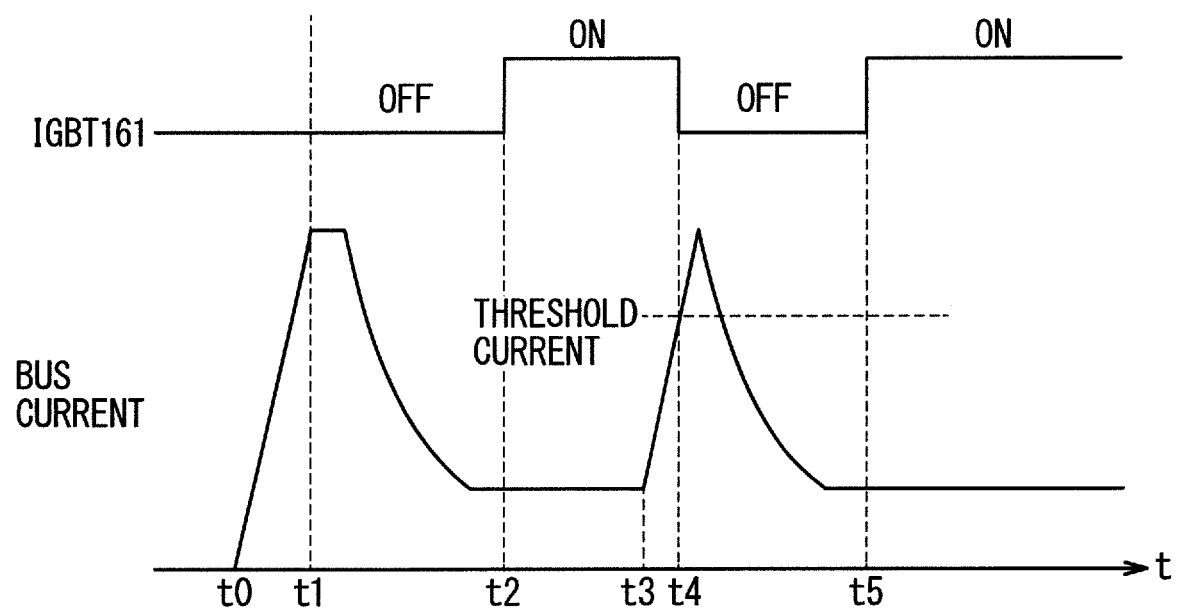
FIG. 4 is a diagram showing transition of a bus current after power supply activation in the semiconductor module according to the first preferred embodiment.

FIG. 4 shows transition of the bus current after power supply activation in the semiconductor module 101. When a power supply (not shown) connected to R, S, T phase terminals of the diode bridge circuit 11 is activated at a time t0, the bus current increases. At the beginning of power supply activation, the protection circuit 18 controls the IGBT 161 to be turned off, and the bus current flows through the current limiting resistor 162. Accordingly, the bus current peaks at a certain value at a time t1, and an overcurrent is prevented. When charging of the electrolytic capacitor 13 is completed, the protection circuit 18 turns on the IGBT 161 at a time t2. When the IGBT 161 is turned on, the bus current flows through the IGBT 161, which suppresses a loss in the current limiting circuit 16A. Thereafter, when an energization abnormality such as an overcurrent occurs at a time t3, and a measured value of the bus current in the sensor 17 exceeds a threshold value at a time t4, the protection circuit 18 turns off the IGBT 161. This decreases the bus current. When the energization abnormality is suppressed, the protection circuit 18 turns on the IGBT 161 at a time t5, thereby suppressing the loss in the current limiting circuit 16A.

<B-3. Effects>

The semiconductor module 101 includes the diode bridge circuit 11, the sensor 17 configured to measure the current value of the diode bridge circuit 11, the current limiting circuit 16A having the IGBT 161 as the first switching element connected to the diode bridge circuit 11, and the protection circuit 18 configured to switch ON and OFF the IGBT 161 in accordance with the current value of the diode bridge circuit 11 measured by the sensor 17. In the semiconductor module 101, by switching ON and OFF the IGBT 161, it is possible to limit the current of the diode bridge circuit 11. Accordingly, the overcurrent can be suppressed not only due to the inrush current at the time of power supply activation but also due to the subsequent energization abnormality. This can prevent breakdown of the diodes constituting the diode bridge circuit 11 or the customer system 15.

The current limiting circuit 16A includes the current limiting resistor 162 connected in parallel to the IGBT 161.

Accordingly, when the IGBT 161 is off, the current flows through the current limiting resistor 162, so that the current of the diode bridge circuit 11 can be limited.

C. Second Preferred Embodiment

<C-1. Configuration>

Figure 5:
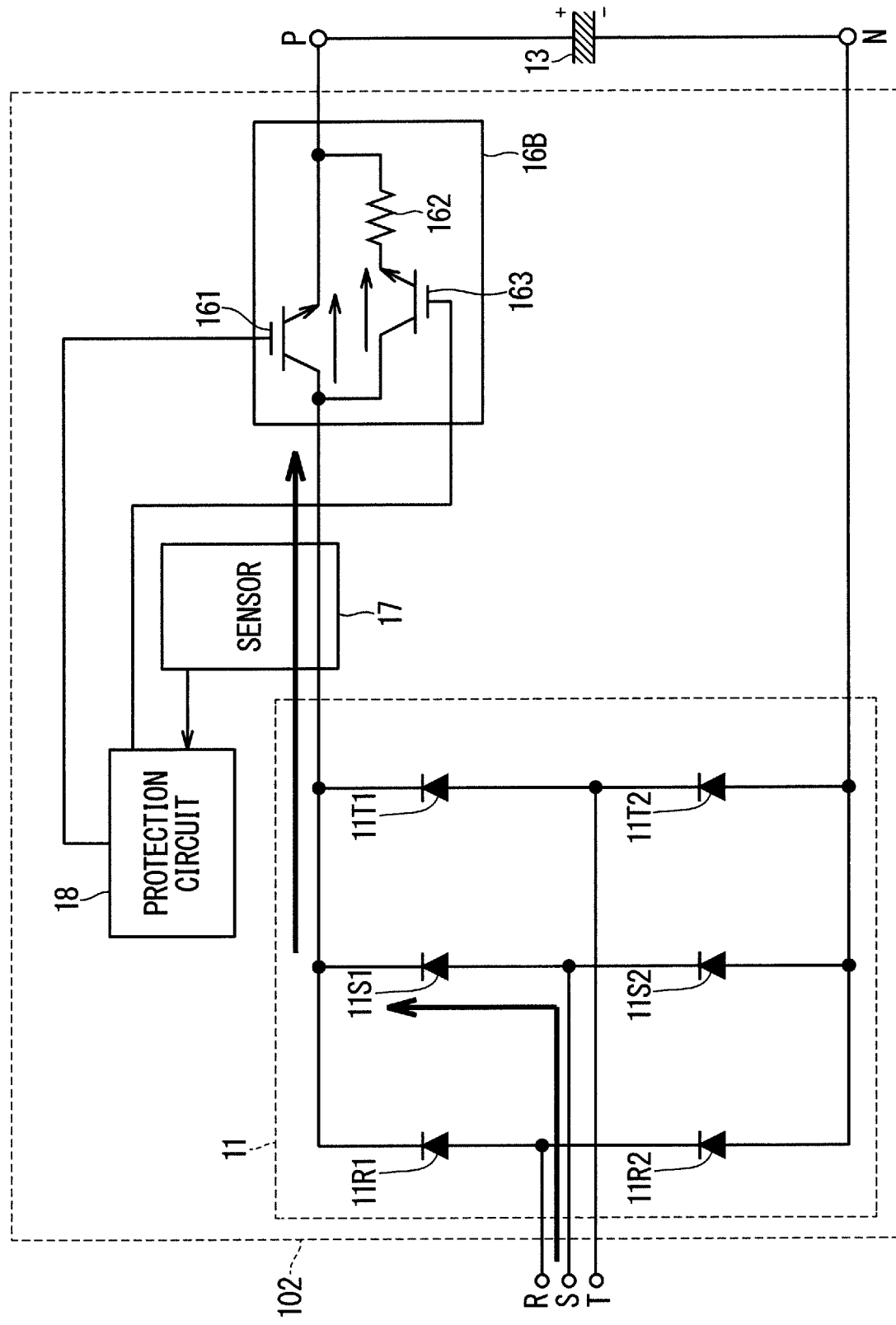
FIG. 5 is a circuit diagram of a semiconductor module according to a second preferred embodiment.

FIG. 5 is a circuit diagram of a semiconductor module 102 according to a second preferred embodiment. As compared with the semiconductor module 101 of the first preferred embodiment, the semiconductor module 102 includes a current limiting circuit 16B instead of the current limiting circuit 16A. In addition to the configuration of the current limiting circuit 16A, the current limiting circuit 16B includes an IGBT 163 as a second switching element. Here, although the IGBT 163 is used as the second switching element, another transistor such as a MOSFET may be used. Configurations of the semiconductor module 102 other than the current limiting circuit 16B are the same as those of the semiconductor module 101.

<C-2. Operation>

Figure 6:
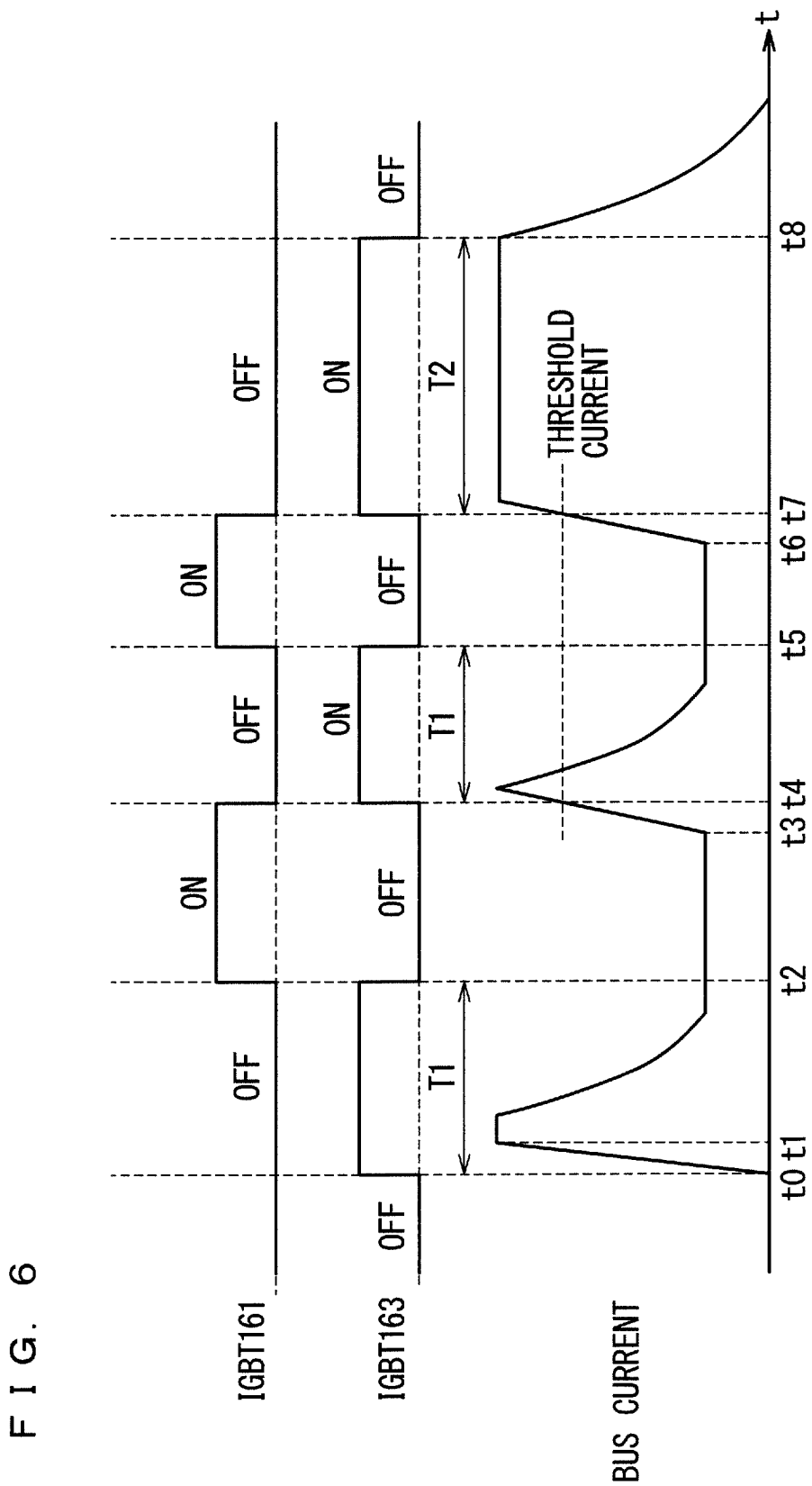
FIG. 6 is a diagram showing transition of the bus current after power supply activation in the semiconductor module of the second preferred embodiment.

FIG. 6 shows transition of the bus current after power supply activation in the semiconductor module 102. Since the operation from the time t0 to the time t5 is the same as that in FIG. 4, description thereof is omitted herein. It is assumed that an energization abnormality such as an overcurrent occurs at a time t6, and that the bus current increases. When the measured value of the bus current in the sensor 17 exceeds the threshold value at a time t7, the protection circuit 18 turns off the IGBT 161 and turns on the IGBT 163. However, it is assumed herein that the bus current does not decrease and that a time period T2 has passed while keeping a value equal to or more than the threshold value. At this time, the protection circuit 18 turns off the IGBT 163 and completely shuts off the current flowing through the current limiting circuit 16B. In this way, the operation of the semiconductor module 102 is completely stopped. The time period T2 is longer than a time period T1 from the time t0 to the time t2 or a time period T1 from the time t4 to the time t5.

<C-3. Effects>

The semiconductor module 102 of the second preferred embodiment includes the IGBT 163, which is the second switching element connected in series to the current limiting resistor 162. If an overcurrent is applied to the current limiting resistor 162 for a long time, there is concern that the current limiting resistor 162 generates heat and the reliability of the semiconductor module 102 is impaired. However, the semiconductor module 102 shuts off the IGBT 163 by the protection circuit 18 and stops the operation when the energization time of the overcurrent exceeds the time period T2, so that the semiconductor module 102 has high reliability.

D. Third Preferred Embodiment

<D-1. Configuration>

Figure 7:
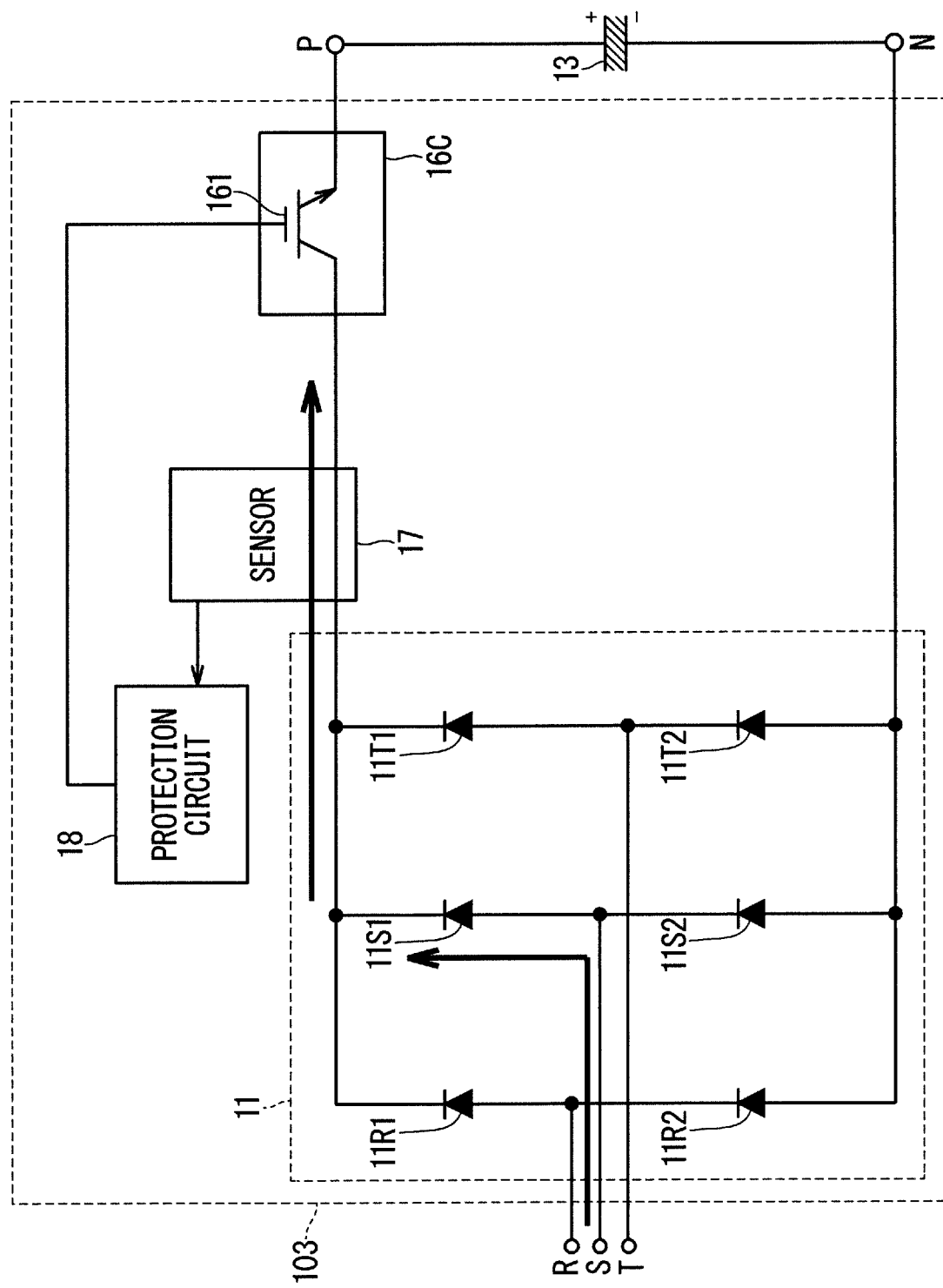
FIG. 7 is a circuit diagram of a semiconductor module according to a third preferred embodiment.

FIG. 7 is a circuit diagram of a semiconductor module 103 according to a third preferred embodiment. As compared with the semiconductor module 101 of the first preferred embodiment, the semiconductor module 103 includes a current limiting circuit 16C instead of the current limiting circuit 16A. The current limiting circuit 16C is configured of only the IGBT 161 as the first switching element. The protection circuit 18 not only switches ON and OFF the IGBT 161 but also controls an on-voltage in two stages. Other configurations of the semiconductor module 103 are the same as those of the semiconductor module 101.

<D-2. Operation>

Figure 8:
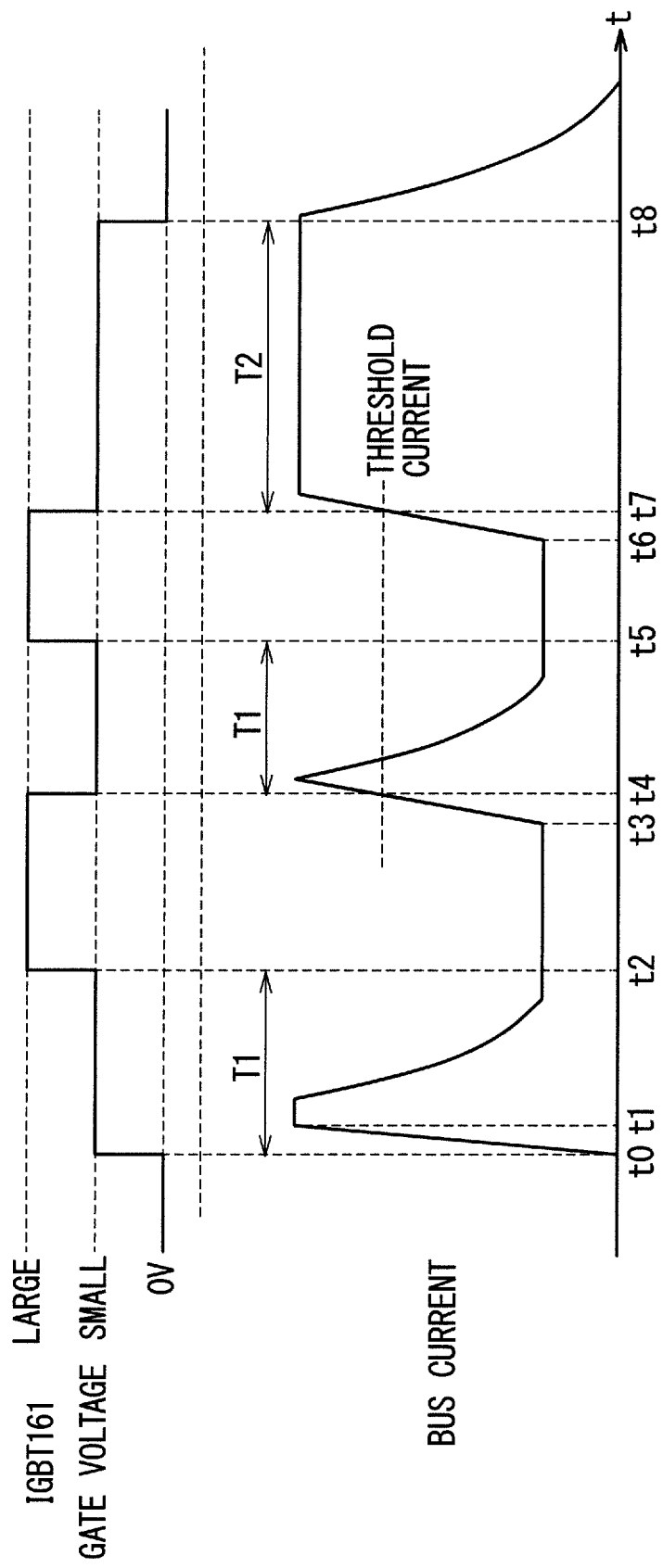
FIG. 8 is a diagram showing transition of the bus current after power supply activation in the semiconductor module of the third preferred embodiment.

FIG. 8 shows transition of the bus current after power supply activation in the semiconductor module 103. When the power supply (not shown) connected to the R, S, T phase terminals of the diode bridge circuit 11 is activated at the time t0, a large current (inrush current) flows because electric charges are charged to the electrolytic capacitor 13. Here, the protection circuit 18 sets a gate voltage of the IGBT 161 to a first on-voltage V1. As a result, although the bus current increases, it peaks at a certain value at the time t1, and an overcurrent is prevented. When the electrolytic capacitor 13 is charged to some extent, the protection circuit 18 sets the gate voltage of the IGBT 161 to a second on-voltage V2 higher than the first on-voltage at the time t2. As a result, the loss in the current limiting circuit 16C is suppressed. Thereafter, when an energization abnormality such as an overcurrent occurs at the time t3 and the measured value of the bus current in the sensor 17 exceeds the threshold value at the time t4, the protection circuit 18 sets the gate voltage of the IGBT 161 to V1. This decreases the bus current. When the energization abnormality is suppressed, the protection circuit 18 sets the gate voltage of the IGBT 161 to V2 at the time t5, thereby suppressing the loss in the current limiting circuit 16C.

It is assumed that an energization abnormality such as an overcurrent occurs at the time t6, and that the bus current increases. When the measured value of the bus current in the sensor 17 exceeds the threshold value at the time t7, the protection circuit 18 sets the gate voltage of the IGBT 161 to V1. However, it is assumed herein that the bus current does not decrease and that the time period T2 has passed while keeping a value equal to or more than the threshold value. At this time, the protection circuit 18 turns off the IGBT 163, that is, sets the gate voltage to 0, which is an off-voltage, and completely shuts off the current flowing through the current limiting circuit 16B. In this way, the operation of the semiconductor module 103 is completely stopped. The time period T2 is longer than the time period T1 from the time t0 to the time t2 or the time period T1 from the time t4 to the time t5.

<D-3. Effects>

In the semiconductor module 103 of the third preferred embodiment, the protection circuit 18 controls a control voltage of the IGBT 161 in at least three stages of the off-voltage, the first on-voltage, and the second on-voltage higher than the first on-voltage in accordance with the current value of the diode bridge circuit 11 measured by the sensor 17. By setting the gate voltage of the IGBT 161 to the first on-voltage, the protection circuit 18 can suppress the inrush current at the power supply activation or the overcurrent due to the subsequent energization abnormality. Further, by setting the gate voltage of the IGBT 161 to the second on-voltage, the protection circuit 18 can suppress the loss in the circuit when the bus current is small. Furthermore, when the overcurrent continues for a long time, the protection circuit 18 turns off the IGBT 161 to completely shut off the current flowing through the semiconductor module 103, which brings about high reliability. In addition, since the current limiting resistor is unnecessary in the current limiting circuit 16C, miniaturization of the semiconductor module 103 can be achieved.

E. Fourth Preferred Embodiment

<E-1. Configuration>

Figure 9:
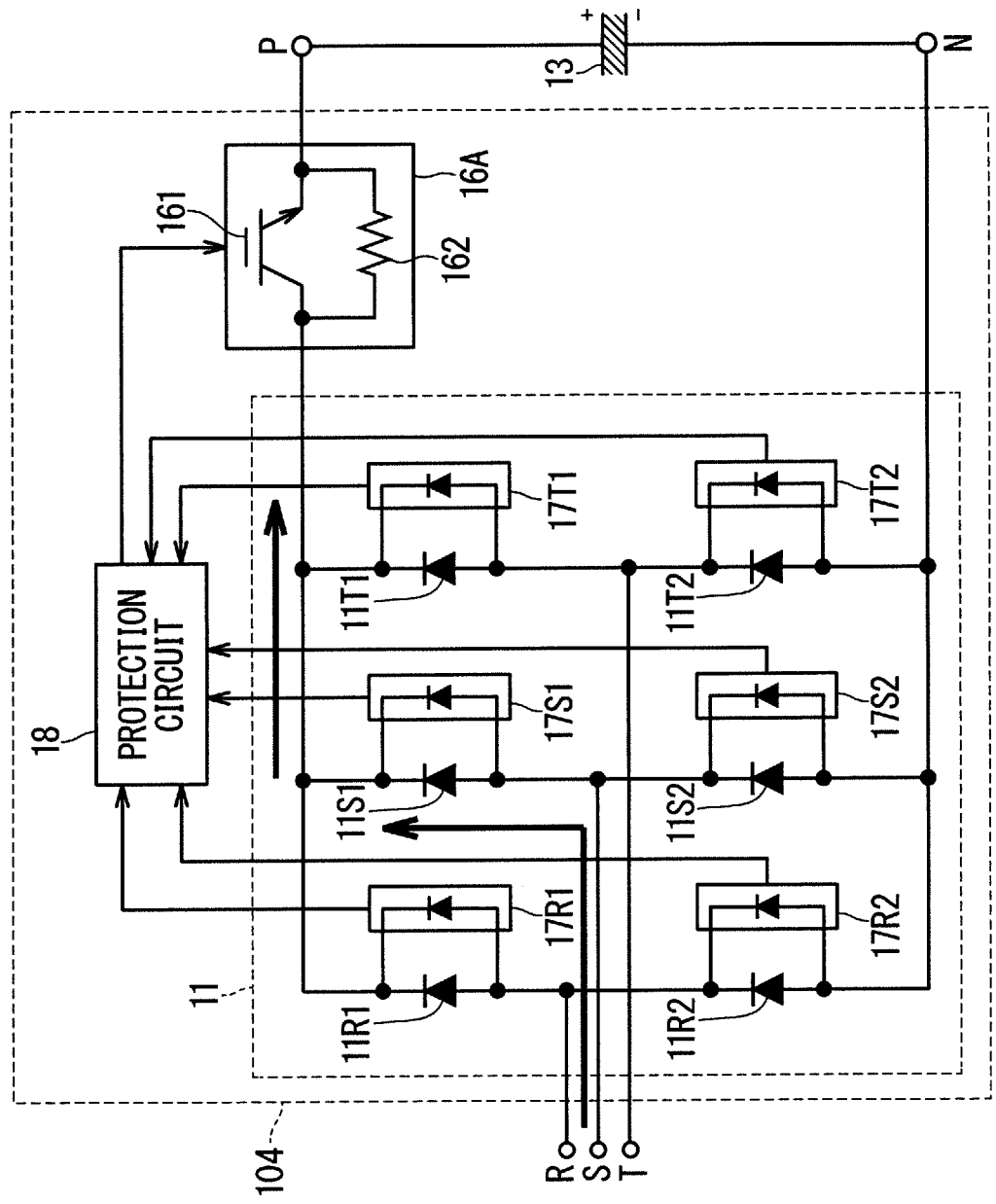
FIG. 9 is a circuit diagram of a semiconductor module according to a fourth preferred embodiment.

FIG. 9 is a circuit diagram of a semiconductor module 104 according to a fourth preferred embodiment. The semiconductor module 104 is different from the semiconductor module 101 of the first preferred embodiment in that a sensor is connected in parallel to each of the diodes 11R1, 11R2, 11S1, 11S2, 11T1, 11T2 constituting the diode bridge circuit 11. Sensors 17R1, 17R2, 17S1, 17S2, 17T1, 17T2 are connected in parallel to the diodes 11R1, 11R2, 11S1, 11S2, 11T1, 11T2, respectively. The sensors 17R1, 17R2, 17S1, 17S2, 17T1, 17T2 each have a sense diode and a shunt resistor, and measure the currents of the diodes 11R1, 11R2, 11S1, 11S2, 11T1, 11T2 to output the measured currents to the protection circuit 18.

<E-2. Effects>

In the first preferred embodiment, the protection circuit 18 controls ON/OFF of the IGBT 161 of the current limiting circuit 16A, based on the total of current values of the diodes of each phase in the diode bridge circuit 11. In contrast, in the semiconductor module 104 of the fourth preferred embodiment, the sensors 17R1, 17R2, 17S1, 17S2, 17T1, 17T2 are connected in parallel to the respective diodes 11R1, 11R2, 11S1, 11S2, 11T1, 11T2 constituting the diode bridge circuit 11, and a current value of each of the diodes 11R1, 11R2, 11S1, 11S2, 11T1, 11T2 is measured as the current value of the diode bridge circuit 11. Accordingly, the protection circuit 18 can control ON/OFF of the IGBT 161, based on the current value of each of the diodes constituting the diode bridge circuit 11. Specifically, the protection circuit 18 turns off the IGBT 161 and performs current limitation if the current value of even one of the diodes 11R1, 11S2, 11S1, 11S2, 11T1, 11T2 exceeds a threshold value. This makes it possible to grasp the current of each phase of the diode bridge circuit 11 more accurately and to perform current limitation, so that high reliability is obtained.

F. Fifth Preferred Embodiment

<F-1. Configuration>

Figure 10:
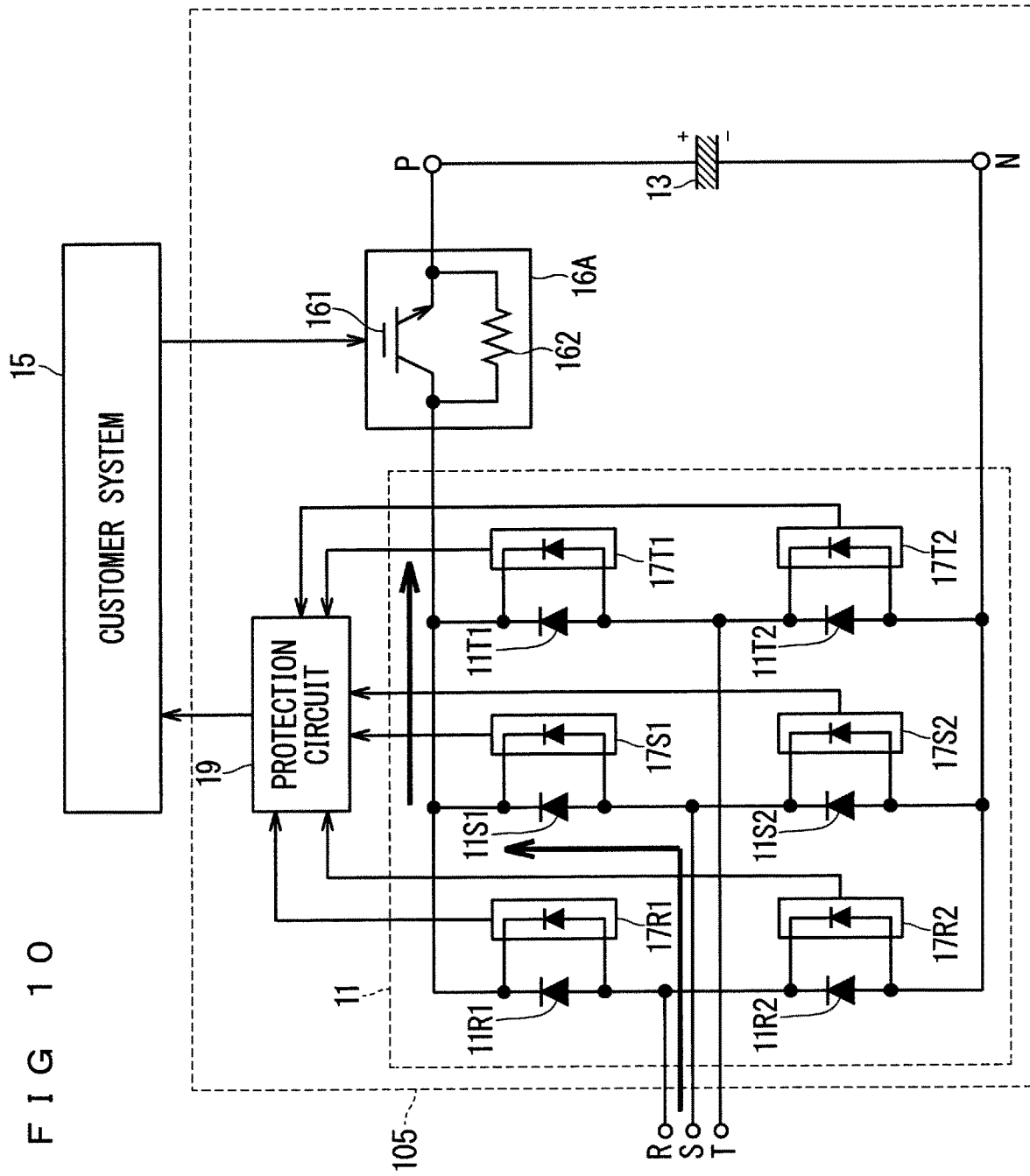
FIG. 10 is a circuit diagram of a semiconductor module according to a fifth preferred embodiment.

FIG. 10 is a circuit diagram of a semiconductor module 105 according to a fifth preferred embodiment. As compared with the semiconductor module 104 of the fourth preferred embodiment, the semiconductor module 105 includes a protection circuit 19 instead of the protection circuit 18. In addition to the function of the protection circuit 18, the protection circuit 19 has a function of outputting an alarm to an outside such as the customer system 15 when an overcurrent occurs in the diode bridge circuit 11.

The protection circuit 19 acquires the current values of the diodes 11R1, 11R2, 11S1, 11S2, 11T1, 11T2 constituting the diode bridge circuit 11 from the sensors 17R1, 17R2, 17S1, 17S2, 17T1, 17T2, respectively. Then, the protection circuit 19 outputs an alarm to the customer system 15 if there is even one of the diodes 11R1, 11R2, 11S1, 11S2, 11T1, 11T2 whose current value exceeds the threshold value. Here, as a method of the alarm, an analog signal may be used, or a digital signal may be used.

<F-2. Effects>

In the semiconductor module 105 of the fifth preferred embodiment, the protection circuit 19 outputs the alarm signal to the outside of the semiconductor module 105 in accordance with the current value of the diode bridge circuit 11 measured by the sensor 17. Accordingly, according to the semiconductor module 105, when an overcurrent is generated in the diode bridge circuit 11, it is possible to output an alarm to the customer system 15. As a result, a customer can protect the semiconductor module 105 or the customer system 15 at arbitrary timing before it breaks down, which brings about high reliability. Moreover, since the customer system 15 can keep a log of the alarms of energization abnormalities, heating abnormalities or the like, it is possible to follow a history of abnormal states, so that troubleshooting at the time of trouble occurrence becomes easy.

G. Sixth Preferred Embodiment

<G-1. Configuration>

Figure 11:
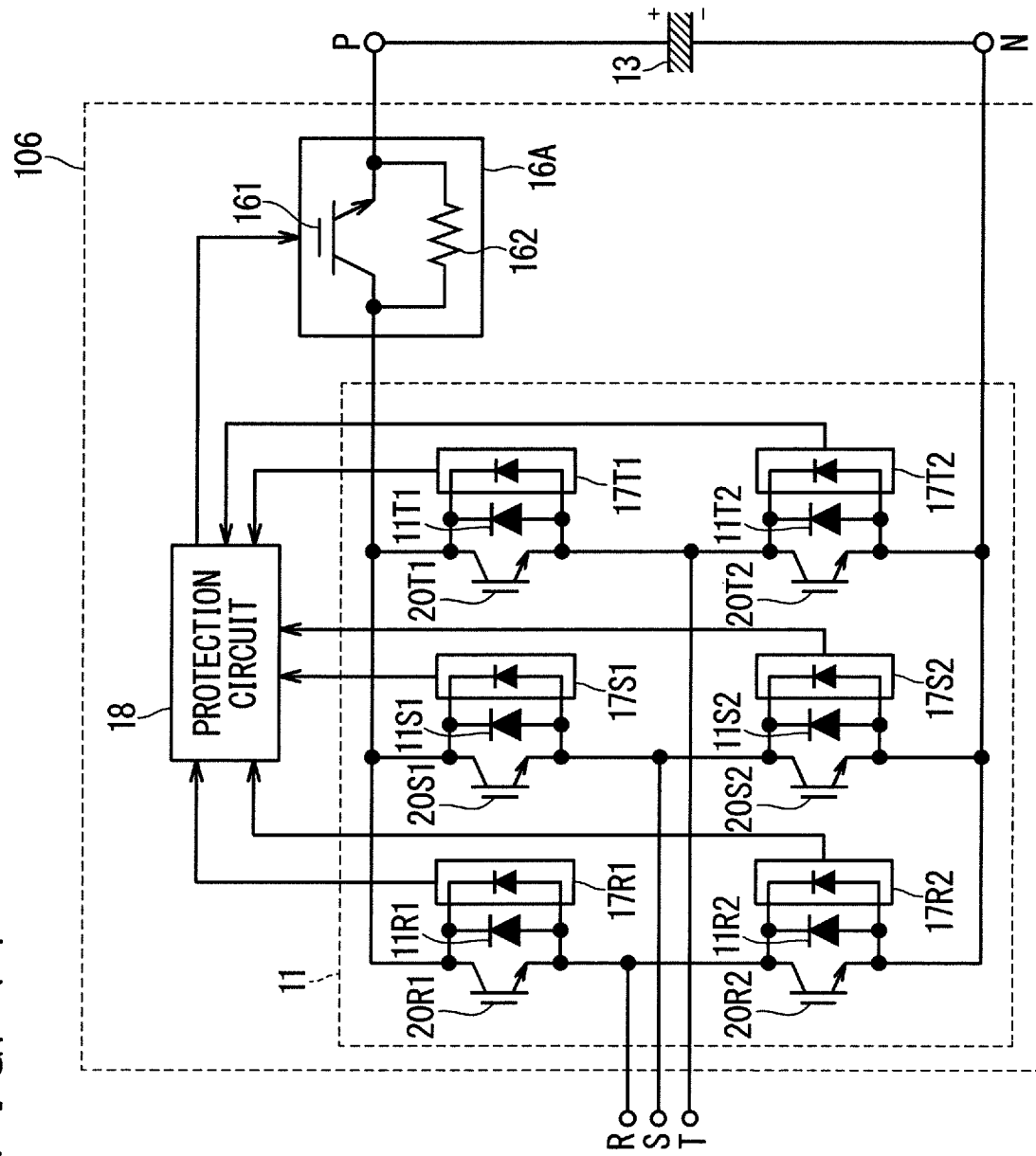
FIG. 11 is a circuit diagram of a semiconductor module according to a sixth preferred embodiment.

FIG. 11 is a circuit diagram of a semiconductor module 106 according to a sixth preferred embodiment. In addition to the configuration of the semiconductor module 104 of the fourth preferred embodiment, the semiconductor module 106 includes IGBTs 20R1, 20R2, 20S1, 20S2, 20T1, 20T2 connected in anti-parallel to the diodes 11R1, 11R2, 11S1, 11S2, 11T1, 11T2 constituting the diode bridge circuit 11.

Figure 12:
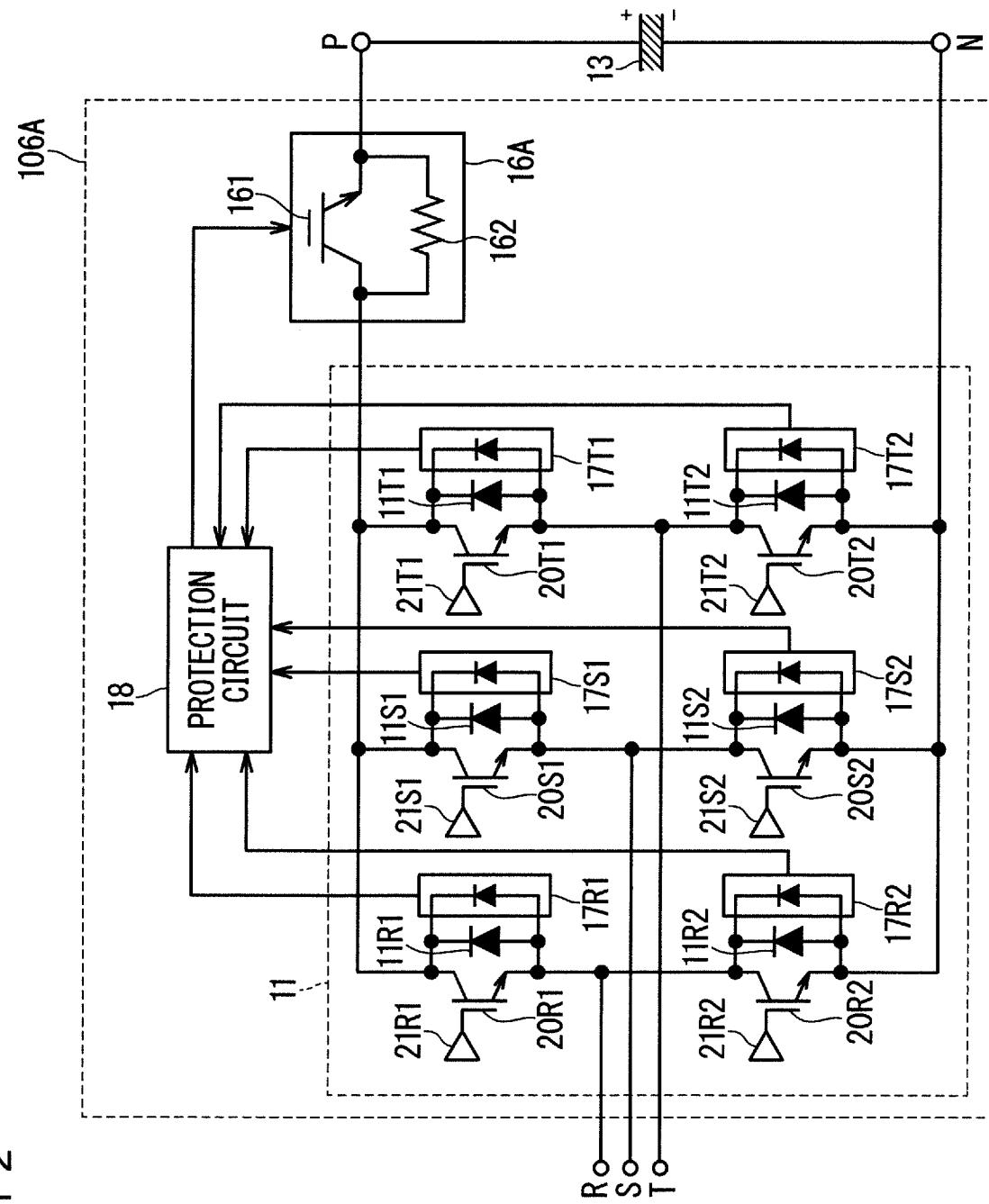
FIG. 12 is a circuit diagram of a semiconductor module according to a modification of the sixth preferred embodiment.

FIG. 12 is a circuit diagram of a semiconductor module 106A according to a modification of the sixth preferred embodiment. As shown in FIG. 12, the semiconductor module 106A includes drive circuits 21R1, 21R2, 21S1, 21S2, 21T1, 21T2 for driving the IGBTs 20R1, 20R2, 20S1, 20S2, 20T1, 20T2 in addition to the configuration of the semiconductor module 106. The semiconductor module 106A may have a protection circuit configured to protect the IGBTs 20R1, 20R2, 20S1, 20S2, 20T1, 20T2 in addition to the drive circuits 21R1, 21R2, 21S1, 21S2, 21T1, 21T2.

<G-2. Effects>

Since each of the semiconductor modules 106, 106A of the sixth preferred embodiment includes the IGBTs 20R1, 20R2, 20S1, 20S2, 20T1, 20T2 connected in anti-parallel to the diodes 11R1, 11R2, 11S1, 11S2, 11T1, 11T2 constituting the diode bridge circuit, respectively, it can be used as a converter module or a converter IPM at the time of power regeneration.

Further, the semiconductor module 106A includes drive circuits 21R1, 21R2, 21S1, 21S2, 21T1, 21T2 of the IGBTs 20R1, 20R2, 20S1, 20S2, 20T1, 20T2 and the protection circuit. Therefore, protection of the diodes 11R1, 11R2, 11S1, 11S2, 11T1, 11T2 and protection of the IGBTs 20R1, 20R2, 20S1, 20S2, 20T1, 20T2 can be performed by the one semiconductor module 106A, which brings about high reliability.

H. Seventh Preferred Embodiment

<H-1. Configuration>

Figure 13:
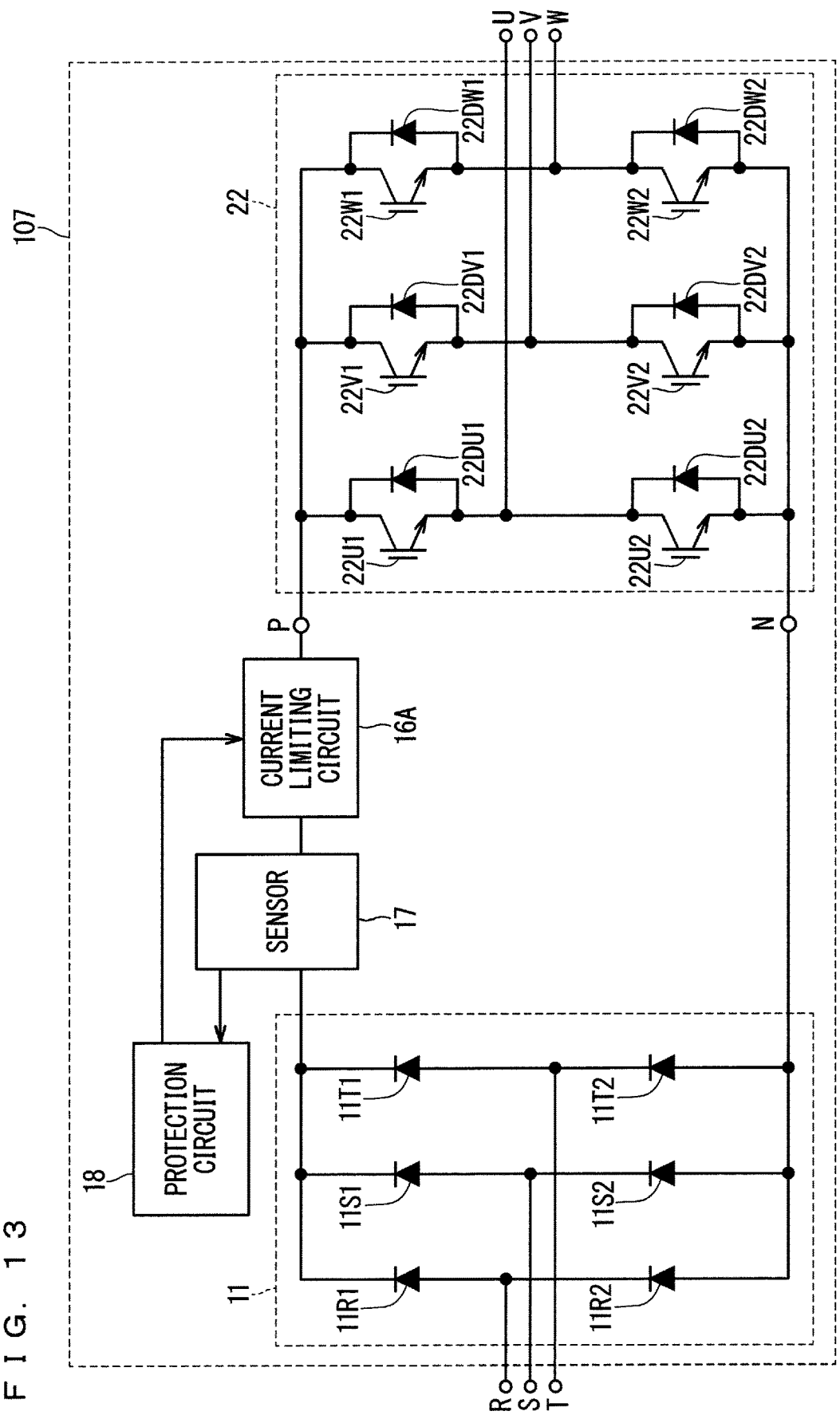
FIG. 13 is a circuit diagram of a semiconductor module according to a seventh preferred embodiment.

FIG. 13 is a circuit diagram of a semiconductor module 107 according to a seventh preferred embodiment. The semiconductor module 107 is an inverter module including an inverter circuit 22 in addition to the configuration of the semiconductor module 101 of the first preferred embodiment. The inverter circuit 22 is connected between the P terminal and the N terminal of the electrolytic capacitor 13. The inverter circuit 22 is provided with an IGBT 22U1 of the U phase upper arm, an IGBT 22U2 of the U phase lower arm, an IGBT 22V1 of the V phase upper arm, an IGBT 22V2 of the V phase lower arm, an IGBT 22W1 of the W phase upper arm, and an IGBT 22W2 of the W phase lower arm. Further, diodes 22DU1, 22DU2, 22DV1, 22DV2, 22DW1, 22DW2 are connected in anti-parallel to the IGBTs 22U1, 22U2, 22V1, 22V2, 22W1, 22W2, respectively.

<H-2. Modification>

The inverter module shown in FIG. 13 can be applied not only to the semiconductor module 101 of the first preferred embodiment but also to the semiconductor modules of the other preferred embodiments as described below.

Figure 14:
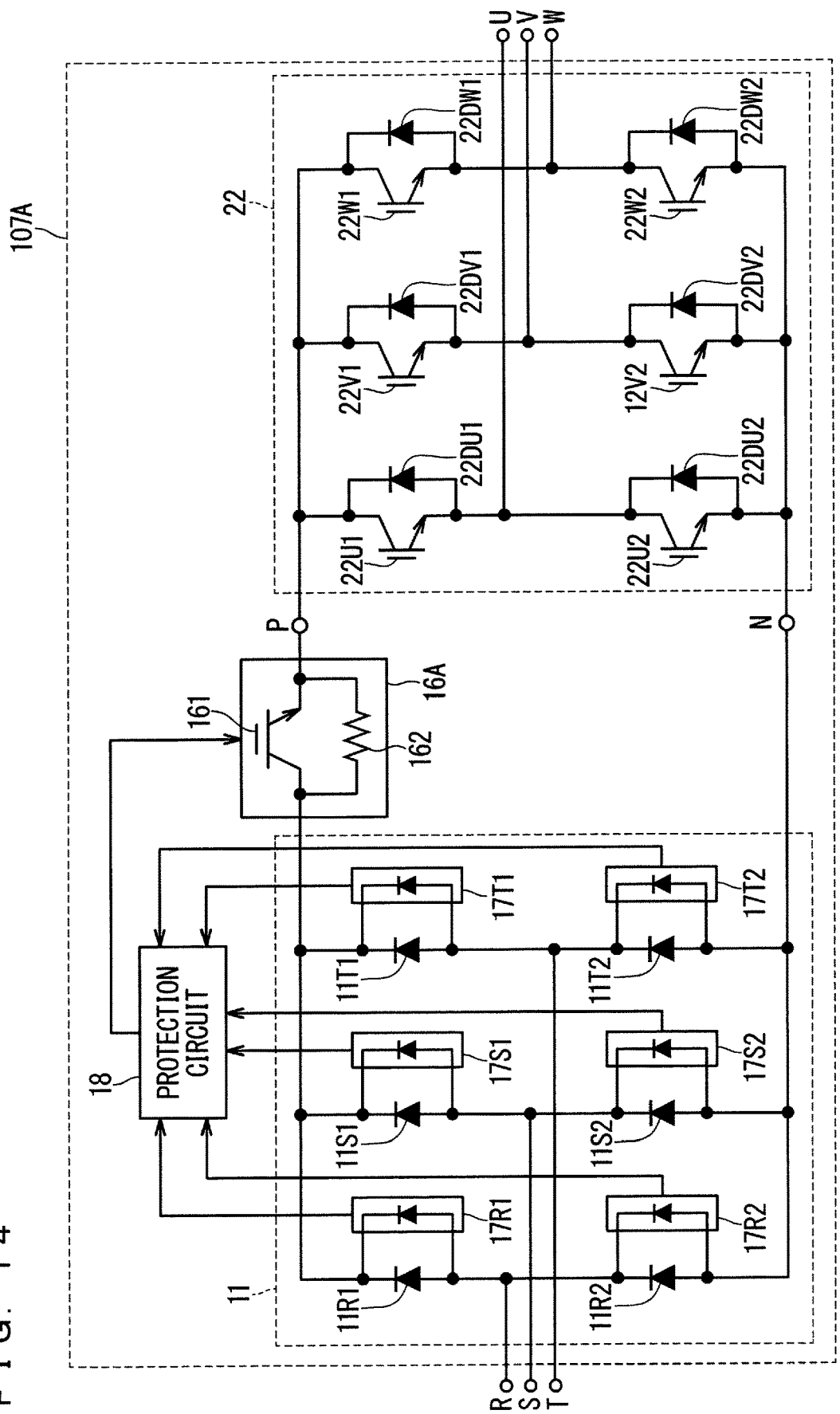
FIG. 14 is a circuit diagram of a semiconductor module according to a first modification of the seventh preferred embodiment.

FIG. 14 is a circuit diagram of a semiconductor module 107A according to a first modification of the seventh preferred embodiment. The semiconductor module 107A is an inverter module including the inverter circuit 22 in addition to the configuration of the semiconductor module 104 of the fourth preferred embodiment.

Figure 15:
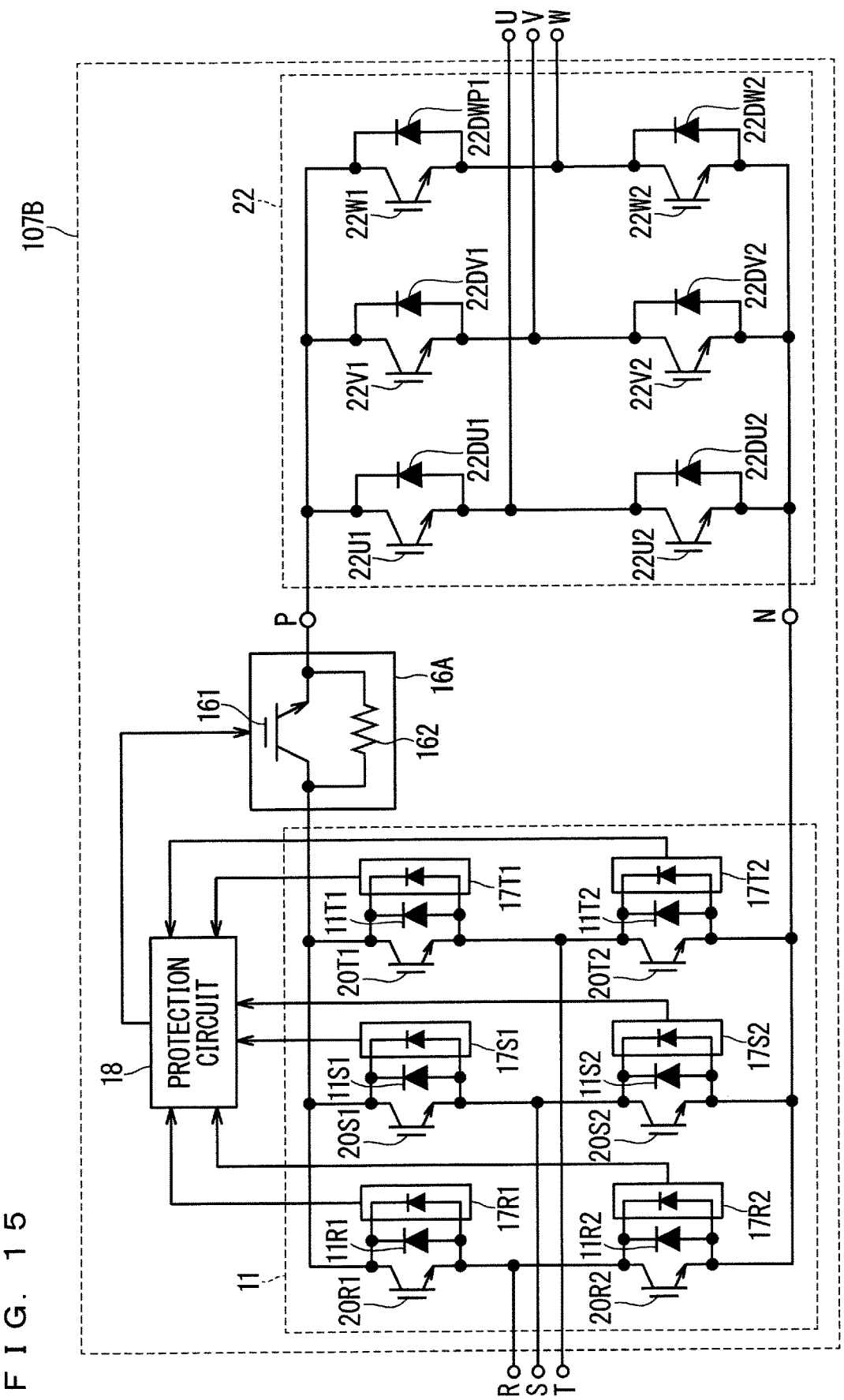
FIG. 15 is a circuit diagram of a semiconductor module according to a second modification of the seventh preferred embodiment.

FIG. 15 is a circuit diagram of a semiconductor module 107B according to a second modification of the seventh preferred embodiment. The semiconductor module 107B is an inverter module including the inverter circuit 22 in addition to the configuration of the semiconductor module 106 of the sixth preferred embodiment.

Figure 16:
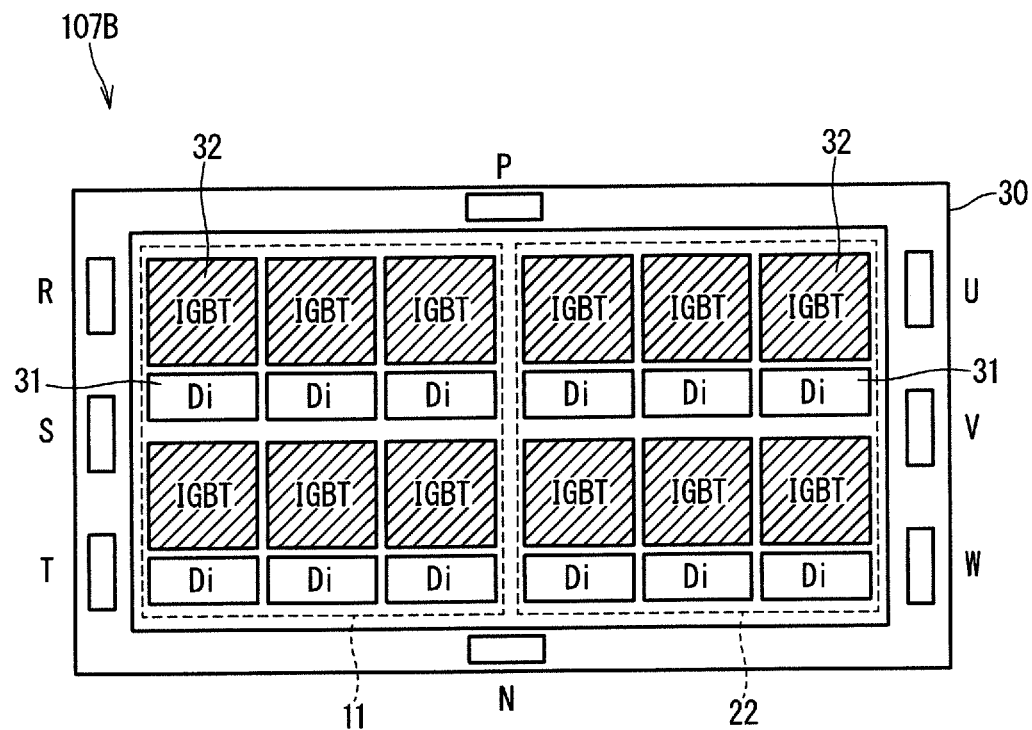
FIG. 16 is a diagram showing a chip configuration of a semiconductor module according to the second modification of the seventh preferred embodiment.

FIG. 16 shows a chip configuration of the semiconductor module 107B. In the semiconductor module 107B, there are six diodes and six IGBTs in the diode bridge circuit 11, and there are six diodes and six IGBTs in the inverter circuit 22. Six diode chips 31 and six IGBT chips 32 are required to configure the diode bridge circuit 11, and the six diode chips 31 and the six IGBT chips 32 are required to configure the inverter circuit 22. That is, in the semiconductor module 107B, a large area is required in a case 30, in which a total of 24 chips of the 12 diode chips and the 12 IGBT chips are mounted.

Figure 17:
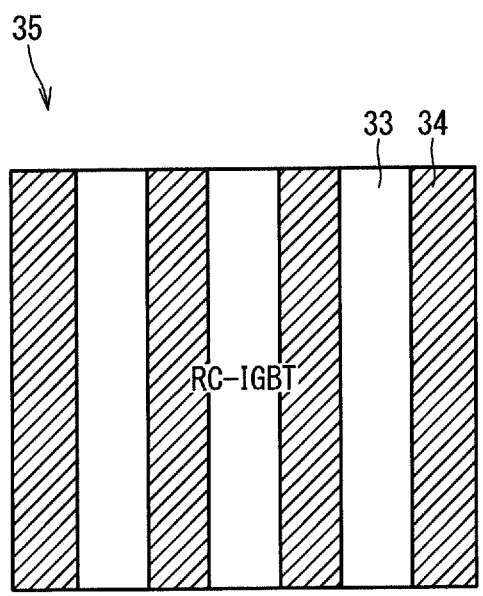
FIG. 17 is a diagram showing an RC-IGBT chip.
Figure 18:
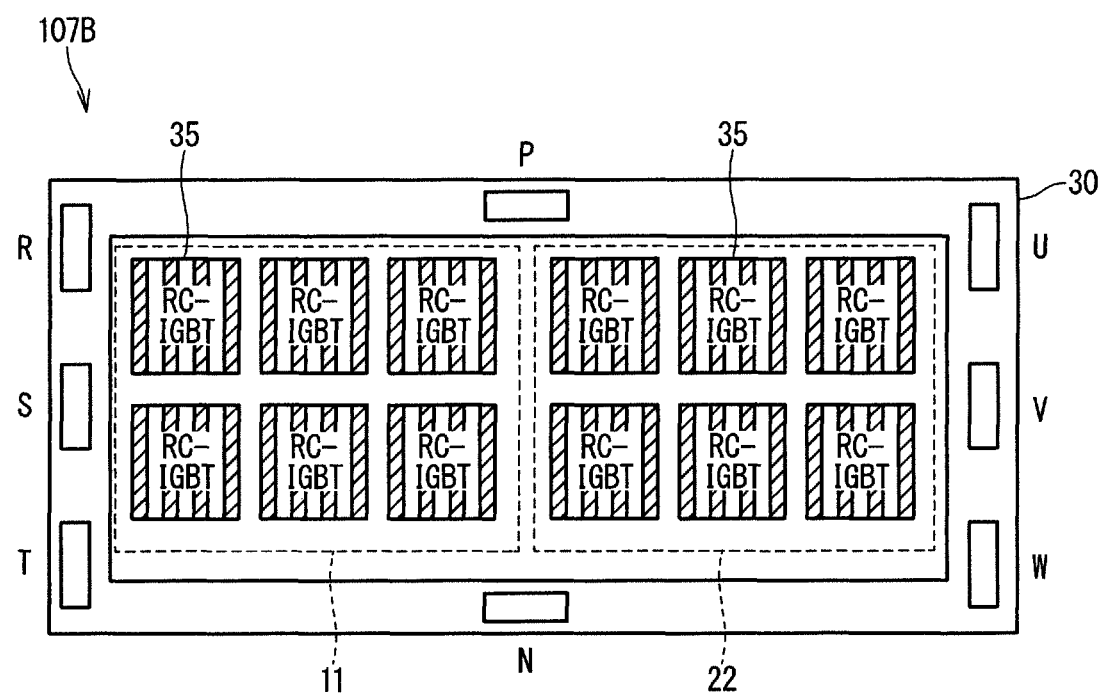
FIG. 18 is a diagram showing a chip configuration of the semiconductor module according to the second modification of the seventh preferred embodiment.

Consequently, the IGBT and the diode in an anti-parallel connection relationship are realized by one RC-IGBT. An RC-IGBT chip 35 results from making the IGBT and the diode into one chip, and has diode portions 33 constituting the diode, and IGBT portions 34 constituting the IGBT, as shown in FIG. 17. As a result, as shown in FIG. 18, the diode bridge circuit 11 of the semiconductor module 107B is configured of the six RC-IGBT chips 35 and the inverter circuit 22 is configured of the six RC-IGBT chips 35, so that the semiconductor module 107B can be realized by a total of 12 RC-IGBT chips 35. Accordingly, it is possible to reduce a mounting area of the chips and to miniaturize the semiconductor module 107B. Although the use of the RC-IGBT in the semiconductor module 107B has been described herein, the RC-IGBT can also be applied to a semiconductor module of another preferred embodiment having an IGBT and a diode in the anti-parallel connection relationship.

<H-3. Effects>

The semiconductor modules 107, 107A, 107B according to the eighth preferred embodiment are each provided with the inverter circuit 22 in addition to the diode bridge circuit 11. By mounting these circuits in the same package, the modules required for power conversion are packaged in one package. Accordingly, by using the semiconductor modules 107, 107A, 107B, it is possible to miniaturize the power conversion apparatus.

In addition, by configuring the diode and the IGBT, which are connected in anti-parallel, by the RC-IGBT in the semiconductor module 107B, the mounting area of the chips can be reduced, and the semiconductor module 107B can be miniaturized.

A wide band gap semiconductor of SiC, GaN or like may be used for the semiconductor element such as the diode or the IGBT included in the semiconductor module 107B. Since the wide band gap semiconductor can be used at a high temperature, demand for the wide band gap semiconductor as a semiconductor module is increasing, and miniaturization and high integration of the semiconductor module using the wide band gap semiconductor are desired. Since the semiconductor module 107B can be miniaturized as shown in FIG. 17, it is suitable for use of the wide band gap semiconductor. In addition, using the wide band gap semiconductor enables the semiconductor modules of the other preferred embodiments to be used at a high temperature.

It is possible to configure a power conversion apparatus such as an inverter apparatus, a converter apparatus, a servo amplifier, or a power supply unit by mounting one or more of the semiconductor modules described in each of the above preferred embodiments. By using the semiconductor module described in each of the preferred embodiments, high reliability or miniaturization of the power conversion apparatus itself can be realized.

In the present invention, within the scope of the invention, each of the preferred embodiments can be freely combined, and each of the preferred embodiments can be appropriately modified or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor module comprising:
   a diode bridge circuit;
   a sensor configured to measure a current value of the diode bridge circuit;
   a current limiting circuit having a first switching element connected to an output of the diode bridge circuit; and
   a protection circuit configured to switch ON and OFF the first switching element in accordance with the current value of the diode bridge circuit measured by the sensor,
   wherein
   the current limiting circuit includes a current limiting resistor connected in parallel to the first switching element,
   the current limiting circuit includes a second switching element connected in series to the current limiting resistor, and
   the protection circuit is configured to turn the first switching element on and the second switching element off based on a first characteristic of the current value, and to turn the second switching element on and the first switching element off based on a second characteristic of the current value, such that the first switching element is turned on after a bus current output from the current limiting circuit reaches a peak at a predetermined time after activating a power supply, which supplies a voltage to the diode bridge circuit, to maintain the bus current at a predetermined level, and when an abnormality characteristic of the current value is detected at an abnormality detection time, the first switching element is turned off and the second switching element is turned on at a predetermined time after the abnormality detection time to limit another peak of the bus current.

2. The semiconductor module according to claim 1, wherein the sensor is connected in parallel to each diode constituting the diode bridge circuit and measures a current value of each of the diodes as a current value of the diode bridge circuit.

3. The semiconductor module according to claim 1, wherein the protection circuit outputs an alarm signal to an outside of the semiconductor module in accordance with the current value of the diode bridge circuit measured by the sensor.

4. The semiconductor module according to claim 1, comprising a plurality of IGBTs connected in anti-parallel to respective diodes constituting the diode bridge circuit.

5. The semiconductor module according to claim 4, wherein the respective diodes constituting the diode bridge circuit and the plurality of IGBTs connected in anti-parallel to the respective diodes are configured of RC-IGBTs.

6. The semiconductor module according to claim 1, further comprising an inverter circuit.

7. The semiconductor module according to claim 1, wherein each diode constituting the diode bridge circuit and the first switching element is configured by using a wide band gap semiconductor.

8. A power conversion apparatus comprising the semiconductor module according to claim 1.

9. A semiconductor module comprising:
a diode bridge circuit;
a sensor configured to measure a current value of the diode bridge circuit;
a current limiting circuit having a first switching element connected to the diode bridge circuit; and
a protection circuit configured to switch ON and OFF the first switching element in accordance with the current value of the diode bridge circuit measured by the sensor, such that the protection circuit controls a control voltage of the first switching element in at least three stages of a first on-voltage in accordance with a first characteristic of the current value of the diode bridge circuit measured by the sensor, a second on-voltage higher than the first on-voltage in accordance with a second characteristic of the current value of the diode bridge circuit measured by the sensor, and an off voltage in accordance with a third characteristic of the current value of the diode bridge circuit measured by the sensor, such that the first switching element is controlled to switch from the off voltage to the first on-voltage upon activating a power supply, which supplies a voltage to the diode bridge circuit, and then is controlled at the second on-voltage to maintain the bus current at a predetermined level after the bus current peaks, and when an abnormality characteristic of the current value is detected at an abnormality detection time, the first switching element is again controlled at the first on-voltage at a predetermined time after the abnormality detection time to limit another peak of the bus current.

* * * * *